Oct. 12, 1965 J. O. McCALDIN 3,211,589

P-N JUNCTION FORMATION IN III-V SEMICONDUCTOR COMPOUNDS

Filed July 14, 1960

James O. McCaldin,
*INVENTOR.*

BY.
Charles S. Haughey

*ATTORNEY.*

United States Patent Office 3,211,589

Patented Oct. 12, 1965

3,211,589
P-N JUNCTION FORMATION IN III–V SEMICONDUCTOR COMPOUNDS

James O. McCaldin, Balboa Island, Calif., assignor to Hughes Aircraft Company, Culver City, Calif., a corporation of Delaware Filed July 14, 1960, Ser. No. 42,878
12 Claims. (Cl. 148—1.5)

This invention relates to the formation of P-N junctions in III–V (periodic table groups) semiconductor compounds, and in its preferred form to the making of diodes and transistors from germanium-containing gallium-arsenide semiconductor crystals.

The production of conductivity-determining types in compound semiconductors, such as gallium-arsenide, does not follow the same rules and procedures as for column IV (of the periodic table) semiconductor materials such as silicon and germanium. Doping of such III–V compound semiconductor crystals with column II or column VI element impurities is common practice today, as noted by Edmond, Proc. Phys. Rev., vol. 73, Pt. 4, 622–7 (April 1959). This requires a double doping procedure, generally in independent steps, and presents many problems of unwanted chemical reactions, unwanted impurities, and complex material handling. This also makes it quite difficult to precisely control conditions to produce thin base transistor devices.

The doping of III–V compound semiconductors with elements from column IV has been studied in special cases, and has been reported in the literature as producing N-type conductivity in most cases, the IV element having a low doping efficiency. This has been interpreted to mean that more of the impurity atoms are located on the column III element sublattice than on the column V element sublattice of the semiconductor crystal. When III–V semiconductor compounds are produced in a standard procedure, their conductivity type is predictable, at least on the basis of prior experience.

According to the present invention, it is believed that the vacancies in the III and V element sublattices may be readjusted, and the relative positions in the sublattices of the III and V elements occupied by the IV element adjusted, by exposure of a column IV element doped III–V semiconductor crystal (whose constituent elements have substantially different vapor pressures) to a controlled temperature, time, and atmosphere pressure of the more volatile of the III and V elements. In every III–V compound presently under practical consideration, the V element is considerably the more volatile.

It is an object and advantage of this invention to produce or change conductivity type in a compound semiconductor crystal with simplified apparatus, under close process control, and with a minimum of variables in the process system to be accommodated.

More particularly, it is an object and advantage of this invention to produce P-N junctions, and junction devices, in a germanium-doped gallium arsenide semiconductor crystal.

The above and other objects and advantages of this invention will be apparent from the balance of this disclosure and the preferred embodiment of the invention illustrated therein and in the accompanying drawing forming a part thereof, wherein.

This invention is illustrated for the III–V semiconductor gallium-arsenide, doped with the column IV impurity germanium.

Figure 1:
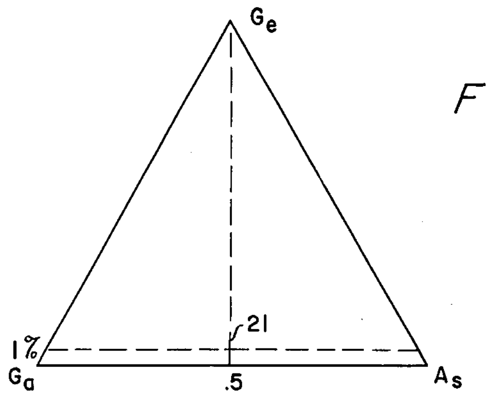
FIG. 1 is an incomplete three-element phase diagram.

Semiconductor crystals of gallium-arsenide have a nominal, or chemically determinable, composition as shown in FIG. 1, a partial phase diagram for the system gallium, arsenic, and germanium. Lines 21 represents semiconductors at 0.5 (50 atomic percent) gallium, 0.5 arsenic, and 0 to over 1% germanium compositions. The gallium-arsenide semiconductor crystals fall on the 50% line, and the germanium dopant may be up to the solubility limit, which is at least 1%, although 0.01 to 1.1% is presently preferred. The curves 11 and 12 are schematic, and may not represent the actual shape of the true curves for the physical data.

In the system gallium-arsenic-germanium, the arsenic is relatively volatile with respect to gallium (and germanium). Although the proportion, for chemical purposes, of gallium and arsenic in the semiconductor crystal do not appreciably change with a change in arsenic pressure over a crystal, it has been found that, by apparent in-diffusion or out-diffusion of arsenic due to controlled vapor pressure and temperature, the conductivity type of the surface-adjacent crystal region may be changed. It is believed that the proportion of lattice vacancies is shifted by adding or removing arsenic atoms, and that germanium atoms then tend to redistribute between the sublattices of gallium and arsenic, thus changing the conductivity type of the crystal. Higher pressures $P_{As}$ of arsenic reduce the concentration of vacancies $V_{As}$ in the arsenic sublattice of the crystal, and by a transfer reaction which may be simplified as $$Ge_{Ga}+V_{As}=Ge_{As}+V_{Ga} \qquad (1)$$

where $Ge_{Ga}$ and $Ge_{As}$ are the germanium atoms in the the respective gallium and arsenic sublattices.

A mass action relationship for equilibrium between vacancies and germanium atoms may be written;

$$\frac{N_{GeGa}}{N_{GeAs}}=K\frac{N_{VGa}}{N_{VAs}} \qquad (2)$$

where $N_{VAs}$, the concentration of vacancies in the arsenic lattice, depends upon the pressure of arsenic in the system. $N_V \times P=K$ (for a monatomic gas), so Equation 2 above may be written in terms of gas pressures. At equilibrium, the gas pressures of As and Ga vary inversely, and $$\frac{N_{GeGa}}{N_{GeAs}}=\frac{P_{As}^{2v}}{P_{As\,0}^{2v}} \qquad (3)$$

where the exponent $v$ is introduced to allow for non-monatomic gas (for arsenic $v=\frac{1}{4}$), and $P_{As\,0}$ is the arsenic vapor pressure for which the impurity germanium atoms are equally distributed between gallium and arsenic vacancy sites. Thus a ten-fold change of arsenic vapor pressure over a gallium arsenide crystal from $P_0$ should make the surface region column IV impurity (germanium) an effective donor or acceptor dopant.

Figure 2:
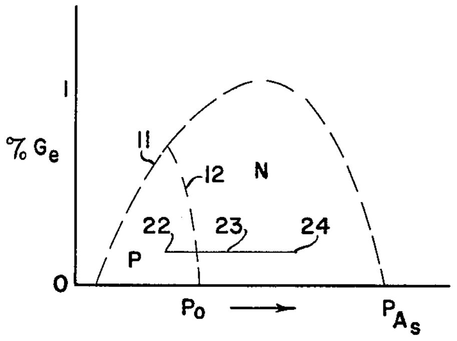
FIG. 2 is a diagram showing conductivity type as a function of arsenic partial pressure and germanium concentration at equilibrium in a gallium-arsenide semiconductor crystal.

As shown in FIG. 2, the equilibrium conductivity type of a germanium doped gallium-arsenide semiconductor crystal changes on line 12 with the arsenic pressure.

For this system, crystals prepared from a gallium-rich melt have an effective $P_0$ for arsenic of less than 1 atmosphere, and are P-type, hence $P_0$ is believed to be less than 1 atmosphere, although the precise pressure is not known. Different production techniques vary the effective atmosphere pressures, and a horizontal zone melting technique has been used to produce N-type material under 1 atmosphere arsenic vapor.

While FIG. 2 assumes a nominal gallium pressure has no substantial effect on the system, due to the kinetics of the reactions, low gallium atmosphere pressure does have a slow, surface effect. This is known as a surface erosion of the crystal, and it is preferably suppressed by use of an inert gas blanket of 1 atmosphere argon with the arsenic vapor.

While accurate prediction of conductivity type and other impurity-connected properties is not always possible, it is a relatively simple matter to measure such properties, then to set conditions to change the conductivity type, and thus to produce a P-N junction. Dashed line 11 represents an equilibrium limit to the P and N regions of the semiconductor crystal structure, and dashed line 12 represents the intrinsic values. The precise location of these lines is not exactly known.

A gallium-arsenide crystal having 1% germanium was produced by the Czochralski method of crystal drawing under 1 atmosphere arsenic vapor pressure. Thus the crystal fell schematically at point 22 in FIG. 2, in a P-type region of the diagram. A slice of the crystal was subjected to 70 hours at 1100° C. and at 5 atmospheres arsenic pressure. The surface of the crystal was converted to N-type, and the P-N junction was from 30 microns to 70 microns below the exposed crystal surface. Thus in FIG. 2, the surface characteristic moved on line 23 to point 24 in the N region during the above high arsenic pressure treatment. Capacity vs. reverse bias measurements indicated linear grading for the doping, confirming a diffusion type process.

Figure 3:
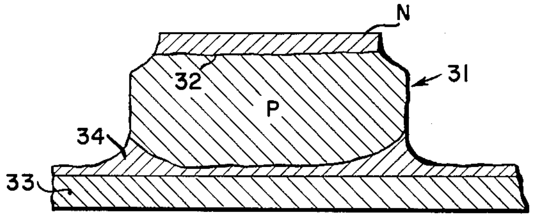
FIG. 3 is a sectional view of a diode made according to this invention.

FIG. 3 shows a diode made from a gallium-arsenide crystal slice of P-type, converted to N-type at the surface as above described. A crystal 31 having P and N regions and a junction 32 is bonded to a tantalum lead 33 by a gold bond 34.

Figure 4:
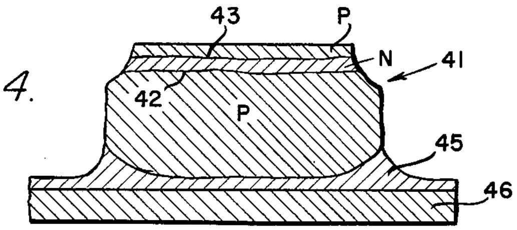
FIG. 4 is a sectional view of a transistor according to this invention.

FIG. 4 shows a similar transistor structure prior to etching a surface area for base lead attachment. A gallium-arsenide crystal 41 having P-N junctions 42, 43 is bonded to a tantalum lead 46 by a gold bond 45.

To produce the transistor structure, a P-type crystal is subjected first to very high arsenic vapor pressure such as 5 atmospheres, then subsequently to a very low vapor pressure less than 0.1 atmosphere. The reconversion to P-type is preferably at a lower temperature to provide better control of diffusion depth. It will be appreciated that N-P-N structures may be produced from originally N-type crystals; and P-N diodes from originally N-type crystals by out-diffusion under low arsenic vapor pressure.

The process of P-N junction formation may be applied to a variety of III–V compounds. Commercially, or chemically, pure gallium-arsenide semiconductor material is believed to contain sufficient silicon, a column IV element, to accommodate the process herein described, and a chemically pure crystal of gallium-arsenide was type changed by the pressure adjustment process herein described.

Normal semiconductor production procedures for III–V compounds vary from compound to compound, primarily in the crystal pulling temperature and the ambient pressure of the V element atmosphere used. The V element atmosphere pressure used for normal crystal growing, called herein the normal crystal growing pressure, is, where attainable, the pressure of the V element which under stoichiometric conditions is in equilibrium with a 1 to 1 liquid solution of the III and V elements.

The normal crystal growing temperature will be the freezing temperature for the semiconductor material at the ambient pressure used, and will of course vary for a given semiconductor material as the pressure used varies from the stoichiometric normal pressure.

In a given normal crystal production process, the conductivity type will be affected by changes in the IV element used as an impurity, but will ordinarily be uniform for a given impurity through a range of concentrations. Thus, in the following Table I, Normal Growing Pressures (absolute) and Normal Growing Temperatures are given for various III–V semiconductor compounds, so far as presently known, and Normal Conductivity Types so produced with various impurities of column IV.

TABLE I

| III-V Compound | Normal Growing Pressure | Normal Growing Temperature, ° C. | Column IV Impurity | Normal Conductivity Type |
|---|---|---|---|---|
| In As | 0.3 atmospheres of As. | 936 | Si<br>Ge<br>Sn | N<br>N<br>N |
| In Sb | Below 1 micron Hg of Sb. | 530 | Si<br>Ge<br>Sn | ?<br>P<br>N |
| In P | 15 to 60 atmospheres of P. | 1,060 | Si<br>Ge<br>Sa | ?<br>N<br>N |
| GaAs | 0.9 atmospheres As. | 1,240 | Si<br>Ge<br>Sn | N<br>N<br>N |
| GaSb | Less than 250 microns Hg (0.0003 atm.). | 702 | Si<br>Ge<br>Sn | P<br>P<br>P |
| GaP | Above 10 atm. | 1,450 | Si<br>Ge<br>Sn<br>C | N<br>?<br>?<br>? |

From the above Table I, taken with the discussion of FIG. 2, it should be readily apparent that a gallium-antimonide semiconductor having silicon, germanium or tin as a column IV impurity, will ordinarily be P-type conductivity as produced. It will be subject to conversion to N-type by subjection to a diffusion treatment in an ambient antimony vapor atmosphere considerably in excess of 0.0003 atmosphere and at a temperature sufficiently below 702° C. to maintain the semiconductor crystal structure usually 100° to 300° C. below the freezing temperature. The depth of the N region formed by this treatment will, of course depend upon the temperature selected and the time of treatment.

Similarly, a semiconductor material of indium-arsenide having as a column IV impurity silicon, germanium or tin should be subject to conversion to P-type at an ambient arsenic atmosphere pressure substantially less than 0.3 atmosphere of arsenic and at a suitable temperature.

The pressure and temperature selected to convert P-type to N-type should not be so high as to change the semiconductor material to a liquid phase; and similarly, the pressure and temperature selected to convert N-type to P-type to a vapor phase. In other words, discretion must be used to avoid changing the semiconductor crystal phase before the conductivity type is changed.

It may be noted that the principles herein taught apply to other III–V semiconductors such as aluminum-phosphide or aluminum-arsenide, although they are not attractive presently as semiconductor materials because of their hygroscopic properties; and indium-antimonide with tin as a predominant IV element impurity, which is unattractive because such low pressures would be required.

What is claimed is:

1. A method for producing a P-N junction in a III–V compound semiconductor crystal which contains an element selected from the group of elements consisting of silicon, germanium and tin as an impurity and said compound is of a conductivity type of the class of P and N, which method comprises: subjecting a surface of said crystal to an atmosphere of the more volatile of said III and V elements at a pressure which varies from the equilibrium pressure and a temperature below the crystal growing temperature and for a time sufficient to convert the surface-adjacent crystal region to the other of said P and N conductivity types.

2. A method according to claim 1 wherein said III-V compound is gallium-arsenide and the atmosphere consists essentially of arsenic.

3. A method according to claim 1 wherein said element is germanium.

4. A method according to claim 1 wherein said III–V compound is gallium-arsenide, the atmosphere consists essentially of arsenic, and said IV element is germanium in the amount of from 0.01 to 0.1%.

5. A method according to claim 1 wherein said crystal is initially of P conductivity type, and is subjected to a pressure of said more volatile element in excess of the equilibrium pressure thereof for an intrinsic semiconductor whereby said surface-adjacent region is converted to N-conductivity type.

6. A method according to claim 1 wherein said crystal is initially of N conductivity type, and is subjected to a pressure of said more volatile element less than the equilibrium pressure thereof for an intrinsic semiconductor whereby the surface-adjacent region is converted to P-conductivity type.

7. A method for producing a P-N junction in a P-type gallium-arsenic semiconductor crystal which comprises: subjecting a surface of the crystal to exposure at 1100° C. to an atmosphere of arsenic vapor of five atmospheres for a time sufficient to convert the surface-adjacent region of the crystal to N-type.

8. A method for producing a P-N junction in an N-type gallium-arsenide semiconductor crystal containing up to 1.0% germanium, which comprises: subjecting a surface of said crystal to exposure to an atmosphere of arsenic vapor at less than 0.1 atmosphere pressure at 1100° C. and for a time sufficient to convert the surface-adjacent region of the crystal to P-type.

9. A method for producing a P-N-P semiconductor structure in a P-type III–V compound semiconductor crystal, which contains a column IV element as an impurity, and in which the V element is substantially more volatile than the III element, which method comprises: subjecting a surface of said crystal to an atmosphere of said V element in excess of the equilibrium pressure thereof for an intrinsic semiconductor, at a temperature and for a time sufficient to convert a surface adjacent region of the crystal to N-type; then subjecting at least a portion of said surface to an atmosphere of said V element at less than the equilibrium pressure thereof for an intrinsic semiconductor, for a time and at a temperature to reconvert a portion of said N-type region to P-type.

10. A method for producing an N-P-N semiconductor structure in an N-type III–V compound semiconductor crystal which contains a column IV element as an impurity and in which the V element is substantially more volatile than the III element, which method comprises: subjecting a surface of said crystal to an atmosphere of said V element at less than the equilibrium pressure thereof for an intrinsic semiconductor, and at a temperature and for a time sufficient to convert a surface-adjacent region of said crystal to P-type; then subjecting at least a portion of said surface to an atmosphere of said V element in excess of the equilibrium pressure thereof for an intrinsic semiconductor at a temperature and for a time sufficient to reconvert a portion of said P-type region to N-type.

11. A method for producing a pair of P-N junctions in a III–V semiconductor of one conductivity type of the class of P and N types; and containing a column IV element as an impurity, which method comprises: subjecting a surface of said semiconductor to an atmosphere of the more volatile of said III and V elements at a pressure and temperature and for a time sufficient to convert a surface-adjacent region of said semiconductor to the opposite of said one conductivity type; then subjecting at least a portion of said surface to an atmosphere of said more volatile element at a pressure and temperature and for a time sufficient to reconvert said portion of said surface-adjacent region to said one conductivity type.

12. A method according to claim 11 wherein the temperature of said reconversion is less than the temperature of said conversion.

References Cited by the Examiner

UNITED STATES PATENTS

| | | | |
|---|---|---|---|
| 2,928,761 | 3/60 | Gremmelmaier et al. | 148—1.5 |

FOREIGN PATENTS

| | | |
|---|---|---|
| 1,184,921 | 4/59 | France. |
| 1,193,194 | 2/59 | France. |

OTHER REFERENCES

Bloem: Philips Research Reports, 11, 273, 1956.

Kolm et al.: Physical Review, vol. 108, 1957, pages 965–971.

Kroger et al.: Solid State Physics, vol. 3, pages 304–435, Academia Press, New York, 1956.

Physical Review, 96, pages 598–602, 1954.

Properties of Elemental and Compound Semiconductors, Interscience Publishers, New York, relied on, August 31 to September 2, 1959. Date published 1960, pages 185–194.

DAVID L. RECK, *Primary Examiner.*

RAY K. WINDHAM, *Examiner.*

UNITED STATES PATENT OFFICE
CERTIFICATE OF CORRECTION

Patent No. 3,211,589 October 12, 1965

James O. McCaldin

It is hereby certified that error appears in the above numbered patent requiring correction and that the said Letters Patent should read as corrected below.

Column 5, line 20, for "gallium-arsenic" read -- gallium-arsenide --.

Signed and sealed this 31st day of May 1966.

(SEAL)
Attest:

ERNEST W. SWIDER
Attesting Officer

EDWARD J. BRENNER
Commissioner of Patents